(12) United States Patent
Sagona et al.

(10) Patent No.: US 10,807,781 B2
(45) Date of Patent: Oct. 20, 2020

(54) PACKAGING FOR HIGH PURITY SOLVENTS

(71) Applicant: SIO MEDICAL PRODUCTS, INC., Auburn, AL (US)

(72) Inventors: Peter J. Sagona, Pottstown, PA (US); Christopher Weikart, Auburn, AL (US)

(73) Assignee: SiO2 Medical Products, Inc., Auburn, AL (US)

( * ) Notice: Subject to any disclaimer, the term of this patent is extended or adjusted under 35 U.S.C. 154(b) by 0 days.

(21) Appl. No.: 15/991,435

(22) Filed: May 29, 2018

(65) Prior Publication Data

US 2018/0273269 A1 Sep. 27, 2018

Related U.S. Application Data

(63) Continuation of application No. 15/128,485, filed as application No. PCT/US2015/022154 on Mar. 24, 2015, now Pat. No. 9,981,784.

(60) Provisional application No. 61/969,756, filed on Mar. 24, 2014.

(51) Int. Cl.
*B65D 77/06* (2006.01)
*C23C 16/04* (2006.01)
*C23C 16/40* (2006.01)
*B65D 65/42* (2006.01)
*C23C 16/50* (2006.01)

(52) U.S. Cl.
CPC .............. *B65D 77/06* (2013.01); *B65D 65/42* (2013.01); *C23C 16/045* (2013.01); *C23C 16/401* (2013.01); *C23C 16/50* (2013.01)

(58) Field of Classification Search
CPC ........ B65D 77/06; B65D 65/42; C23C 16/50; C23C 16/401; C23C 16/045
See application file for complete search history.

(56) References Cited

U.S. PATENT DOCUMENTS

| | | | | |
|---|---|---|---|---|
| 3,648,882 A | * | 3/1972 | Shelton | B65D 25/14 220/495.01 |
| 3,775,181 A | * | 11/1973 | Ryerson | H01M 10/399 429/103 |
| 3,938,708 A | * | 2/1976 | Burger | B65D 83/62 222/95 |
| 4,169,540 A | * | 10/1979 | Larsson | B65D 77/062 206/205 |

(Continued)

FOREIGN PATENT DOCUMENTS

| | | |
|---|---|---|
| EP | 0251812 | 1/1988 |
| EP | 0728676 | 8/1996 |
| JP | 05-096688 | 4/1993 |

OTHER PUBLICATIONS

International Search Report and Written Opinion for International Patent Application No. PCT/US2015/022154, dated Jun. 29, 2015.

*Primary Examiner* — Kareen K Thomas
(74) *Attorney, Agent, or Firm* — McAndrews Held & Malloy, Ltd.

(57) ABSTRACT

A container includes an external package and a sealed flexible bag, adapted to hold liquid contents, retained within the external package. The bag is made from a polymer film, which prior to being formed into a bag, was a two dimensional film to which was applied a PECVD SiOx coating.

11 Claims, 5 Drawing Sheets

(56) References Cited

U.S. PATENT DOCUMENTS

| | | | | |
|---|---|---|---|---|
| 5,356,029 | A * | 10/1994 | Hogan | B65D 77/061 222/105 |
| 5,390,814 | A * | 2/1995 | Christine | A61J 1/05 156/293 |
| 5,769,273 | A * | 6/1998 | Sasaki | B65D 5/606 222/105 |
| 6,338,870 | B1 * | 1/2002 | Jaccoud | B05D 1/62 427/171 |
| 7,832,576 | B2 * | 11/2010 | Cohn | A61J 9/005 215/11.1 |
| 7,878,425 | B2 * | 2/2011 | Handzel | B05B 7/241 141/2 |
| 7,958,995 | B2 * | 6/2011 | Dedmon | B65D 77/061 206/386 |
| 7,975,879 | B2 * | 7/2011 | Groesbeck | B65D 5/4204 220/4.01 |
| 8,002,145 | B2 * | 8/2011 | Anjos | B65D 77/061 206/509 |
| 8,424,682 | B2 * | 4/2013 | Cassina | B65D 77/061 206/386 |
| 8,459,503 | B2 * | 6/2013 | Groesbeck | B65D 5/4204 220/592.01 |
| D713,193 | S * | 9/2014 | English | D7/306 |
| 9,371,143 | B2 * | 6/2016 | Hefner | B65B 1/02 |
| 9,751,656 | B2 * | 9/2017 | Wolf | B65D 77/062 |
| 2002/0117503 | A1 * | 8/2002 | Lundquist | B62B 5/0083 220/495.1 |
| 2004/0142182 | A1 * | 7/2004 | Olofsson | B32B 27/08 428/423.5 |
| 2005/0244083 | A1 * | 11/2005 | McMahon | B65D 33/20 383/63 |
| 2008/0272146 | A1 * | 11/2008 | Kaczmarek | B65D 75/525 222/105 |
| 2008/0308564 | A1 * | 12/2008 | Hall | B32B 27/08 220/662 |
| 2010/0012550 | A1 * | 1/2010 | Dedmon | B65D 77/061 206/600 |
| 2010/0266825 | A1 * | 10/2010 | Lee | B32B 27/08 428/214 |
| 2012/0145710 | A1 * | 6/2012 | Corbett | B65D 77/06 220/9.4 |
| 2013/0301959 | A1 * | 11/2013 | Tom | B65B 31/003 383/109 |

* cited by examiner

PACKAGING FOR HIGH PURITY SOLVENTS

CROSS-REFERENCE TO RELATED APPLICATIONS

This application is a U.S. Continuation of application Ser. No. 15/128,485, filed Sep. 23, 2016, which is U.S. National Phase of International Application No. PCT/US2015/022154 filed Mar. 24, 2015, which claims priority to U.S. Provisional Patent Application No, 61/969,756 filed. Mar. 24, 2014, which are incorporated herein by reference in then entirety.

BACKGROUND OF THE INVENTION

The present disclosure relates to containers and methods of making the same. More particularly, the present disclosure relates to containers suitable for packaging high purity solvents, such as hexane, and the use of chemical vapor deposition technology, for example plasma enhanced chemical vapor deposition, for providing a solvent, oxygen, or other bather for such containers.

High purity solvents have many industrial applications, for example, in analytical chemistry, environmental analysis and biotechnology. These solvents are typically stored in glass containers (e.g., bottles or other vessels), because the inert property of glass makes it ideal for storing high purity solvents. However, traditional glass solvent containers are prone to breakage or degradation during manufacture, filling operations, shipping and use, which means that glass particulates may enter the solvent, thus degrading the solvent's purity.

While plastic containers are less prone to breakage, their use as primary packaging for high purity solvents may be limited due to their gas (e.g., oxygen) permeability. The permeability of plastics to gases is significantly greater than that of glass and therefore may be unacceptable as primary packaging for high purity solvents. Further, some high purity solvents, such as hexane, for example, tend to degrade and eat through plastic containers.

The problem of permeability and degradation has been addressed in some applications (for example, pharmaceutical packaging), by adding a barrier coating or layer to a plastic package where it contacts fluid contents of the package. One such barrier layer is a very thin coating of $SiO_x$, applied, for example, by plasma enhanced chemical vapor deposition ("PECVD"). The advantage of using a $SiO_x$ barrier coating or layer on, e.g., a plastic vessel, is that in several respects, favorable aspects of both glass and plastic are combined into one package.

An $SiO_x$ barrier coating or layer contains silicon, oxygen, and optionally other elements. Barrier coatings and processes of applying them to substrates, e.g., pharmaceutical packages, are described, e.g., in U.S. Pat. No. 7,985,188, which is incorporated herein by reference in its entirety.

While a $SiO_x$-coated plastic container is preferable to an uncoated plastic container for storing high purity solvents, standard containers have drawbacks. For example, three dimensional containers that undergo $SiO_x$ coating of their interior surfaces may not be uniformly coated, both in terms of coating thickness and coverage. For example, there is potential that the $SiO_x$ coating may miss spots along the interior surfaces of a plastic container. Just as a chain is only as strong as its weakest link, a purportedly $SiO_x$-coated plastic container in which even tiny portions of the interior surface are uncoated or have other imperfections, may be subject to degradation at those vulnerable spots by the contents of the container, e.g., a high purity solvent such as hexane. Accordingly, there is a need for a three dimensional container, e.g., for containing high purity solvents, that is better adapted for more uniform and complete $SiO_x$ coating, e.g., using PECVD, than standard three dimensional plastic containers.

SUMMARY OF THE INVENTION

Accordingly, in one aspect, there is provided a container comprising an external package, e.g., a box, comprising therein a sealed flexible bag. The bag comprises a film, e.g., a polyethylene film, which, prior to being formed into a three dimensional sealed bag adapted to hold liquid contents, is a two dimensional film. Preferably, the two dimensional film is substantially free of surface imperfections. A $SiO_x$ coating is applied, e.g. using PECVD, to the two dimensional film before the film is formed into a bag. In one aspect, the $SiO_x$ coating on the two dimensional film, which is formed into a sealed three dimensional bag, is less prone to imperfections, missed spots and cracking than a conventional three dimensional $SiO_x$ coated plastic container. Thus, in one aspect, the invention represents an improvement over conventional three dimensional glass or plastic containers for holding high purity solvents.

Other aspects of the invention will be apparent from this disclosure and the accompanying drawings.

Figure 1:
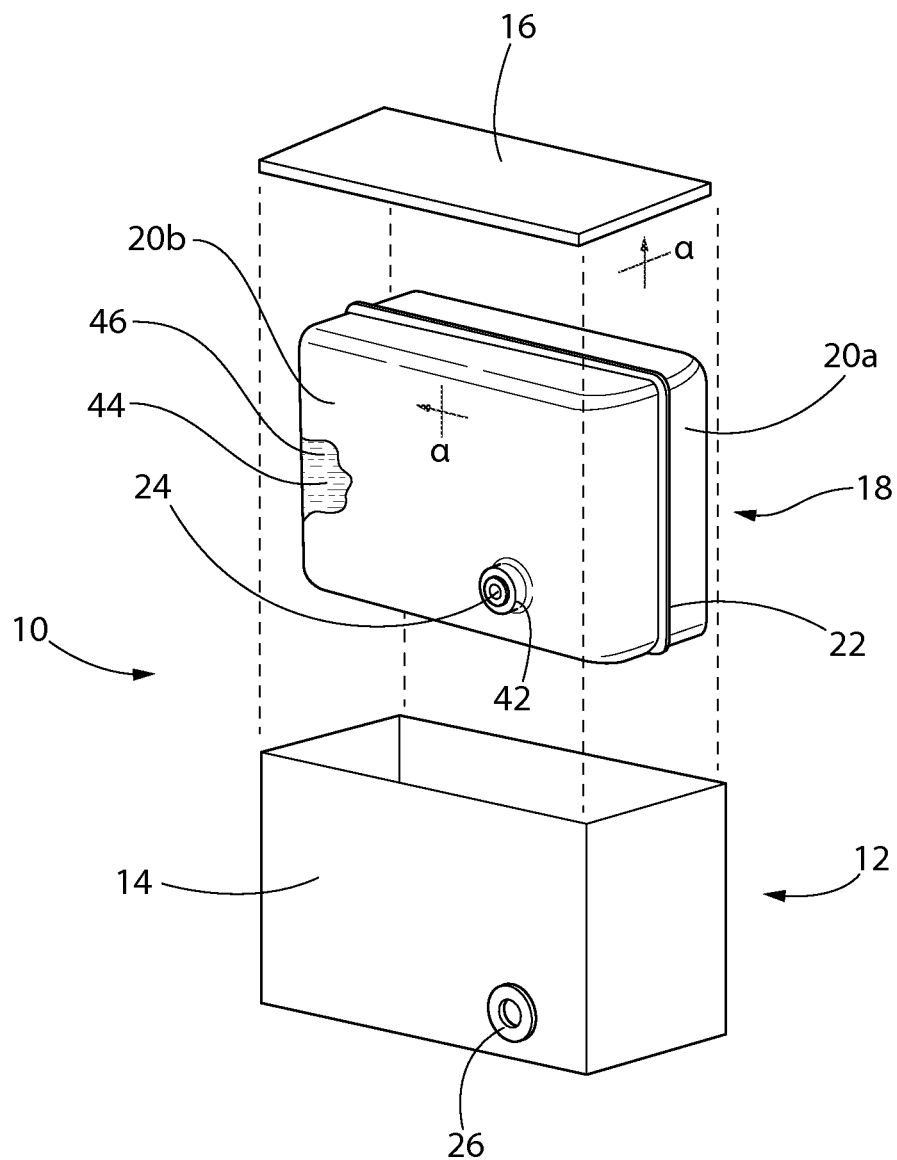
FIG. 1 illustrates an exploded perspective view of a container according to the present invention, with the flexible bag 18 partially cut away to illustrate its interior.

The following reference characters are used in this description and the accompanying drawings.

| | |
|---|---|
| 10 | Container |
| 12 | External package |
| 14 | Package body |
| 16 | Package lid |
| 18 | Flexible bag |
| 20a | Film sheet |

| | |
|---|---|
| 20b | Film sheet |
| 22 | Seal |
| 24 | Spout |
| 26 | Opening (in 12) |
| 28 | End seal |
| 30 | Barrier coating |
| 32 | Surface portion |
| 34 | Lapped seal |
| 36 | Face-to-face seal |
| 38 | Side seal |
| 40 | Perimeter seal |
| 42 | Valve (of 24) |
| 44 | Solvent |
| 46 | Lumen |
| 48 | Fused portion |
| 100 | PECVD apparatus (FIG. 2) |
| 102 | Polymer film (FIG. 2) |
| 104 | Unwind reel |
| 106 | Quick roller |
| 108 | Guide roller |
| 110 | Rewind reel |
| 112 | Chamber |
| 114 | Treatment area |
| 116 | Diffusion pump |
| 118 | Gas inlet |
| 120 | Unbalanced magnetron |
| 122 | Plasma energy source |
| 124 | Cathode |
| 202 | Polymer film (FIG. 3) |

DETAILED DESCRIPTION OF THE PREFERRED EMBODIMENTS

The present invention will now be described more fully with reference to the accompanying drawings, in which several embodiments are shown. This invention may, however, be embodied in many different forms and should not be construed as limited to the embodiments set forth here. Rather, these embodiments are examples of the invention, which has the full scope indicated by the language of the claims. Like numbers refer to like elements throughout.

The present invention is directed to containers and methods of making the same, preferably for storage of high purity solvents. Such solvents may include, for example: acetonitrile, dichloromethane (methylene chloride), ethyl ether, hexane, methanol, toluene, acetone, benzene, chloroform, diethyl ether, dimethylformamide, dimethyl sulfoxide, ethanol, heptane, isopropanol, pyridine, tetrahydrofuran and water. In a preferred embodiment, the high purity solvent stored in a container according to the present invention is hexane.

Referring to FIG. 1, there is shown an embodiment of a container 10 according to the present invention. The container 10 is optionally constructed using standard methods for making wine boxes. Wine boxes generally include wine contained in a plastic bag. The plastic bag is retained in a box (usually cardboard), which provides a protective shell and rigid structure for retaining the bag. Examples of wine boxes and processes for making the same are disclosed in U.S. Pat. Nos. 3,474,933 and 4,274,554 and U.S. Pat. App. Pub. No. 2012/0255971, all of which are incorporated by reference herein in their entireties.

The embodiment of the container 10 according to the present invention includes an external package 12, optionally comprising a package body 14 and package lid 16, although a unitary package is also within the scope of the present invention. The external package 12 is preferably constructed from an inexpensive rigid or semi-rigid material, such as cardboard, plastic or a soft metal (e.g., aluminum).

The container 10 further includes a sealed flexible bag 18 for containing a liquid, such as a high purity solvent (preferably hexane). The bag, which is retained within the external package 12, is preferably constructed from polyethylene or another thin, flexible polymer with similar physical properties to polyethylene. The flexible bag 18 is made of at least one film sheet 20 having major surface portions 32.

The film sheets 20 may alternatively be packaging laminates of any number of different layers, which can include water vapor sealing layers, support layers, heat sealable layers, decorative layers, print layers, tie layers, and the like. Such laminates are well known in the packaging industry, and need not be described in detail here.

A barrier coating 30 from 2 to 1000 nanometers (nm) thick, optionally from 10 to 200 nm thick, optionally from 20 to 200 nm thick, optionally from 20 to 30 nm thick, is optionally provided on at least one major surface portion 32. For the purposes of the present disclosure the thickness of the SiOx coating or layer or other barrier coating or layer is determined by transmission electron microscopy (TEM). Optionally in any embodiment, the bather coating 30 comprises or consists essentially of SiOx, in which x is from about 1.5 to about 2.9, or 1.5 to about 2.6, or about 2, or about 2.3. For the purposes of the present disclosure the value of x, and thus the ratio of silicon to oxygen, is determined by x-ray photoelectron spectroscopy, commonly known as XPS. Optionally, other types of barrier layers can instead be used.

The barrier coating 30 optionally faces the lumen 46, as is desirable when the barrier layer 30 functions to protect the film sheet 20 from the contents of the lumen 46. In an embodiment, the film sheet 20 has first and second major surfaces 32 on opposite sides of the sheet 20 and the barrier coating 30 is on the first major surface 32 only, preferably defining the interior surface, illustrated in FIGS. 4 and 5. Optionally, the barrier coating 30 is coextensive with the first major surface 32, although it could optionally extend into the seal 22 but not all the way to the extreme side edge at the outside of the seal.

Figure 6:
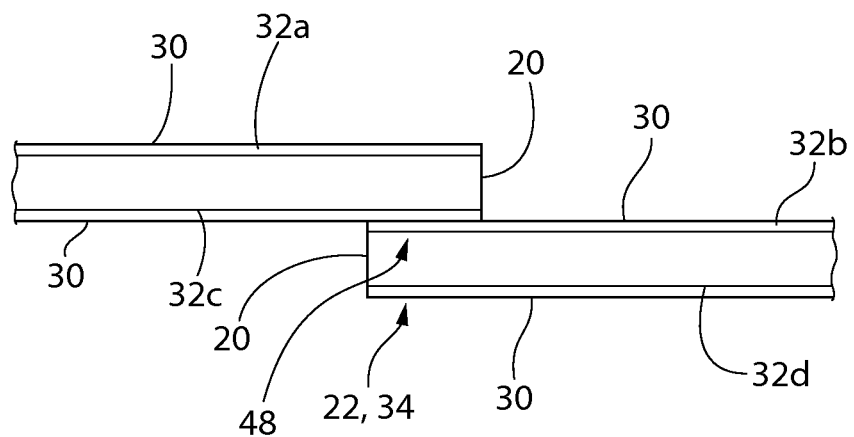

Another advantage of providing a barrier coating 30 on the inside surface of the flexible bag 18, is that this protects the barrier coating 30 somewhat from abrasion and other damage during handling and transportation. Optionally in any embodiment, each of the facing major surface portions 32 is at least partially coated with the barrier coating 30. Optionally, each of the facing major surfaces 32 is entirely coated with the barrier coating 30, completely enveloping the lumen 46 without interruption (except in the vicinity of the spout 24, which can be made in such a fashion as to prevent leakage or permeation by the contents of the flexible bag 18). This embodiment is illustrated in FIG. 6, and is also an option in the embodiment of FIG. 4.

Figure 4:
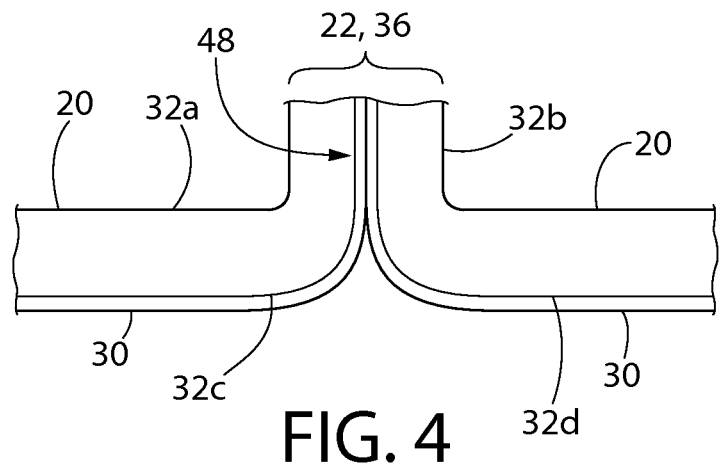
FIG. 4 illustrates a fragmentary section taken along section line a-a in FIG. 1 or FIG. 7 of a face-to-face seal according to any embodiment of this invention.
Figure 5:
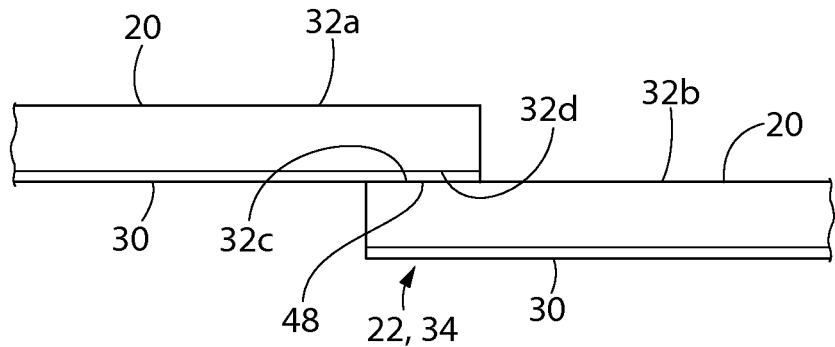
FIGS. 5 and 6 illustrate fragmentary sections taken along section line a-a in FIG. 1 or FIG. 7 of a lapped seal according to any embodiment of this invention.

At least one seal 22 is provided between facing major surface portions 32. The reference character 22 in this disclosure or the drawings indicates a seal generically. Seals 22 having various forms are more specifically defined as a face-to-face seal 36 as illustrated in FIG. 4, a lapped seal 34, illustrated in FIGS. 5 and 6, an end seal 28, illustrated in FIG. 7, and a side seal 38, also illustrated in FIG. 7. While end seals 28, side seals 38, and perimeter seals 40 commonly are face-to-face seals, lapped seals 34 can alternatively be used in any embodiment. Other seal types and patterns can also be used, without limitation. At least one film sheet 20 and at least one seal 22 define a flexible bag 18 comprising a lumen 46.

The barrier coating 30 optionally extends into the seal 22. The barrier coating 30 extends into the seal 22 as defined in this specification if, in the seal as assembled, the barrier coating 30 is located between the fused portions 48 of the respective film sheets 20 that are joined. Thus, FIGS. 4, 5, and 6 all illustrate a barrier coating 30 extending into the seal 22. The embodiment of FIG. 4, in which barrier coatings 30 on both sides of the seal 22 extend into the seal is preferred, although the embodiments of FIGS. 5 and 6, in which a barrier coating on only one side of the seal extends into the seal, are also contemplated, particularly when the primary concern is providing a barrier to ingress of oxygen, rather than an internal barrier to egress of the solvent or other fluid contents 44.

It is contemplated that the barrier coating 30, which is extremely thin and has very little volume, will not prevent the use of heat sealing or ultrasonic sealing methods to fuse the adjacent film sheets 20, providing the facing surfaces of the film sheets 20 are directly heat-sealable to each other. It is further contemplated that in the process of heat or ultrasonic sealing, the portion of the barrier coating 30 extending into the seal 22 will be disrupted, allowing direct contact between the adjacent film sheets 20. After sealing, the barrier coating 30 is still regarded as extending into the seal if it was present before the seal was effected, whether or not it can be detected within the finished seal. Alternatively, however, the seal can be effected by placing an adhesive between the surfaces sealed together, as is well known.

Figure 7:
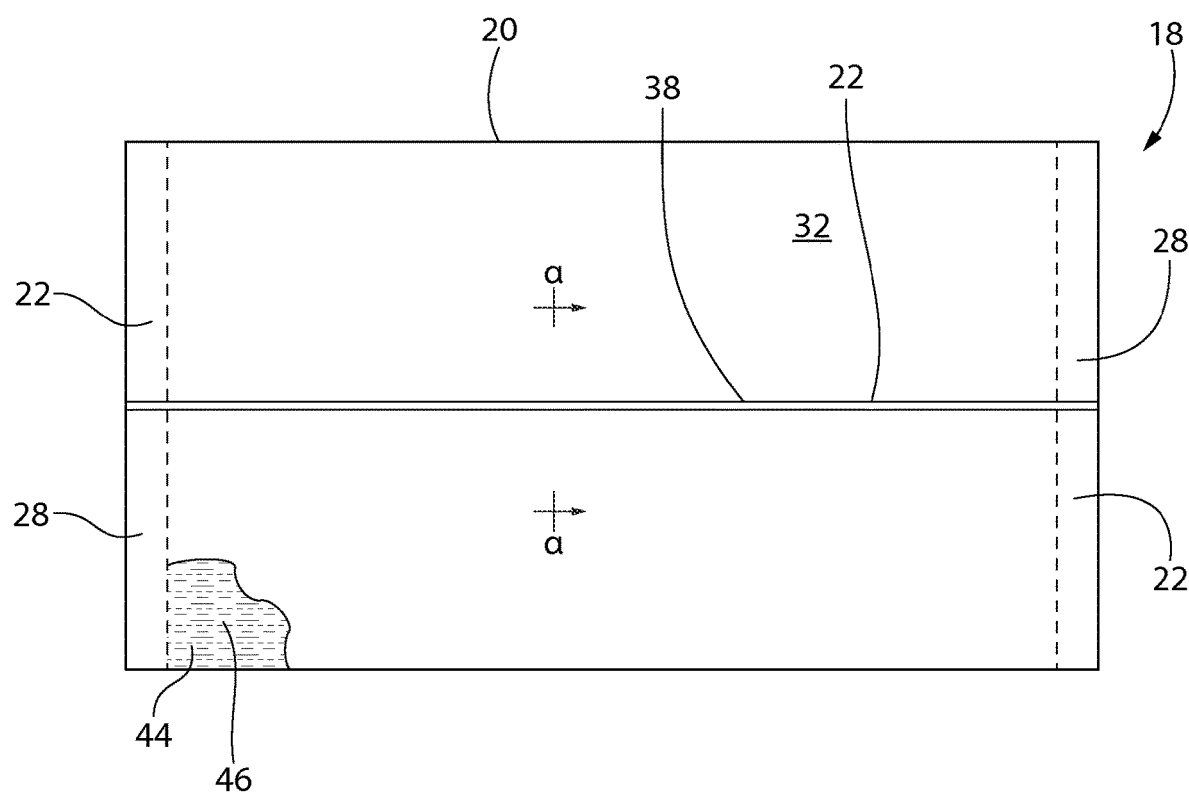
FIG. 7 illustrates a plan view of a flexible bag 18 having an alternative seal plan, which can be substituted in FIG. 1 in any embodiment, with the flexible bag 18 partially cut away to illustrate its interior.

The bag 18 is optionally made from a single two dimensional polymer film sheet that is formed into a three dimensional bag. This embodiment is illustrated in FIG. 7, showing a single sheet 20 in which each side has been folded inward, with the free ends of the respective sides registered and sealed together to form the side seal 38. The respective ends have been sealed with end seals 28. Thus, the flexible bag 18 is formed from a single film sheet 20 joined by a side seal 38 and first and second end seals 28.

Alternatively, the bag 18 can be made from two or more separate (originally two dimensional) film sheets 20a, 20b, which are joined together and sealed along a seal (also known as a spine) 22 according to known methods, to form a three dimensional bag 18, as illustrated in FIG. 1. In this embodiment, the two sheets 20a and 20b are joined by a perimeter seal 40.

Optionally, the bag 18 includes an openable spout 24, which is adapted to seat within an opening 26 in the external package 12. A user wishing to release liquid contents (e.g. a high purity solvent) from the bag 18 when the bag 18 holds such contents may open the spout 24.

The bag 18, as described above, is made from one or more two dimensional polymer film sheets. According to an aspect of the present invention, before the one or more polymer film sheets are used to construct the bag, they are coated, e.g. on one side or both sides, with an $SiO_x$ coating or layer, preferably using plasma enhanced chemical vapor deposition (PECVD). It is contemplated that a two dimensional polymer film sheet, e.g., polyethylene, is an optimal surface on which to apply an $SiO_x$ coating or layer because a flat film is less prone to having surface imperfections that can affect the integrity of a $SiO_x$ coating than, e.g., the internal surface of a three dimensional container. With fewer such surface imperfections, there is a lower likelihood or incidence of unevenness of coating, missed spots, surface imperfections and cracking, than a conventional three dimensional $SiO_x$ coated plastic container. As such, it is contemplated that high purity solvents held in a container according to the present invention would have less of an opportunity to contact and attack the polymer substrate of the bag 18 than would a conventional three dimensional $SiO_x$ coated plastic container.

Optionally, the $SiO_x$ coating may be part of a coating set. For example, a tie coating or layer, a barrier coating or layer, and a pH protective coating or layer, collectively referred to herein as a "trilayer coating," may be applied to the flexible sheet of the bag. With a trilayer coating, the barrier coating or layer of $SiO_x$ optionally is protected against contents having a pH otherwise high enough to remove it by being sandwiched between the pH protective coating or layer and the tie coating or layer, each being optionally an organic layer of $SiO_xC_y$ as defined in this specification.

Optionally, the tie coating or layer comprises SiOxCy or SiNxCy, preferably can be composed of, comprise, or consist essentially of SiOxCy, wherein x is from about 0.5 to about 2.4 and y is from about 0.6 to about 3. The atomic ratios of Si, O, and C in the tie coating or layer 34 optionally can be: Si 100:O 50-150:C 90-200 (i.e. x=0.5 to 1.5, y=0.9 to 2); Si 100:O 70-130:C 90-200 (i.e. x=0.7 to 1.3, y=0.9 to 2); Si 100:O 80-120:C 90-150 (i.e. x=0.8 to 1.2, y=0.9 to 1.5); Si 100:O 90-120:C 90-140 (i.e. x=0.9 to 1.2, y=0.9 to 1.4); or Si 100:O 92-107:C 116-133 (i.e. x=0.92 to 1.07, y=1.16 to 1.33). The atomic ratio can be determined by XPS. Taking into account the H atoms, which are not measured by XPS, the tie coating or layer 34 may thus in one aspect have the formula SiwOxCyHz (or its equivalent SiOxCy), for example where w is 1, x is from about 0.5 to about 2.4, y is from about 0.6 to about 3, and z is from about 2 to about 9. Typically, tie coating or layer 34 would hence contain 36% to 41% carbon normalized to 100% carbon plus oxygen plus silicon.

Optionally, the tie coating or layer can be similar or identical in composition with the pH protective coating or layer described elsewhere in this specification, although this is not a requirement.

Optionally, the tie coating or layer is on average between 5 and 200 nm (nanometers), optionally between 5 and 100 nm, optionally between 5 and 20 nm thick. These thicknesses are not critical. Commonly but not necessarily, the tie coating or layer 34 will be relatively thin, since its function is to change the surface properties of the substrate. Optionally, the tie coating or layer is applied by PECVD, for example of a precursor feed comprising octamethylcyclotetrasiloxane (OMCTS), tetramethyldisiloxane (TMDSO), or hexamethyldisiloxane (HMDSO).

Certain barrier coatings or layers such as SiOx as defined here have been found to have the characteristic of being subject to being measurably diminished in barrier improvement factor in less than six months as a result of attack by certain relatively high pH contents of the coated vessel as described elsewhere in this specification, particularly where the barrier coating or layer directly contacts the contents. Barrier layers or coatings of SiOx are eroded or dissolved by some fluids, for example aqueous compositions having a pH above about 5. Since coatings applied by chemical vapor deposition can be very thin—tens to hundreds of nanometers thick—even a relatively slow rate of erosion can remove or reduce the effectiveness of the barrier layer in less time than the desired shelf life of a product package. This is particularly a problem for aqueous fluids having a pH of from 4 to 9. The higher the pH of the contents of a coated container or bag, the more quickly it erodes or dissolves the SiOx coating.

The pH protective coating or layer optionally provides protection of the underlying barrier coating or layer against contents of the bag 18 having a pH from 4 to 9, including where a surfactant is present.

Applicant has found that certain pH protective coatings or layers of SiOxCy or SiNxCy formed from polysiloxane precursors, which pH protective coatings or layers have a substantial organic component, do not erode quickly when exposed to fluids, and in fact erode or dissolve more slowly when the fluids have pHs within the range of 4 to 8 or 5 to 9. For example, at pH 8, the dissolution rate of a pH protective coating or layer made from the precursor octamethylcyclotetrasiloxane, or OMCTS, is quite slow. These pH protective coatings or layers of SiOxCy or SiNxCy can therefore be used to cover a barrier layer of SiOx, retaining the benefits of the barrier layer by protecting it from the fluid in the bag. The protective layer is applied over at least a portion of the SiOx layer to protect the SiOx layer from contents stored in a vessel, where the contents otherwise would be in contact with the SiOx layer. The pH protective coating or layer optionally is effective to keep the barrier coating or layer at least substantially undissolved as a result of attack by the fluid for a period of at least six months.

The pH protective coating or layer 38 can be composed of, comprise, or consist essentially of SiwOxCyHz (or its equivalent SiOxCy) or SiwNxCyHz or its equivalent SiNxCy), each as defined previously, preferably SiOxCy, wherein x is from about 0.5 to about 2.4 and y is from about 0.6 to about 3. The atomic ratios of Si, O, and C in the pH protective coating or layer 286 optionally can be: Si 100:O 50-150:C 90-200 (i.e. x=0.5 to 1.5, y=0.9 to 2); Si 100:O 70-130:C 90-200 (i.e. x=0.7 to 1.3, y=0.9 to 2); Si 100:O 80-120:C 90-150 (i.e. x=0.8 to 1.2, y=0.9 to 1.5); Si 100:O 90-120:C 90-140 (i.e. x=0.9 to 1.2, y=0.9 to 1.4); or Si 100:O 92-107:C 116-133 (i.e. x=0.92 to 1.07, y=1.16 to 1.33); or Si 100:O 80-130:C 90-150.

The thickness of the pH protective coating or layer as applied optionally is between 10 and 1000 nm; alternatively from 10 nm to 900 nm; alternatively from 10 nm to 800 nm; alternatively from 10 nm to 700 nm; alternatively from 10 nm to 600 nm; alternatively from 10 nm to 500 nm; alternatively from 10 nm to 400 nm; alternatively from 10 nm to 300 nm; alternatively from 10 nm to 200 nm; alternatively from 10 nm to 100 nm; alternatively from 10 nm to 50 nm; alternatively from 20 nm to 1000 nm; alternatively from 50 nm to 1000 nm; alternatively from 50 nm to 800 nm; optionally from 50 to 500 nm; optionally from 100 to 200 nm; alternatively from 100 nm to 700 nm; alternatively from 100 nm to 200 nm; alternatively from 300 to 600 nm. The thickness does not need to be uniform throughout the vessel, and will typically vary from the preferred values in portions of a vessel.

Optionally, the pH protective coating or layer is at least coextensive with the barrier coating or layer. The pH protective coating or layer alternatively can be less extensive than the barrier coating, as when the fluid does not contact or seldom is in contact with certain parts of the barrier coating absent the pH protective coating or layer. The pH protective coating or layer alternatively can be more extensive than the barrier coating, as it can cover areas that are not provided with a barrier coating.

The pH protective coating or layer 38 optionally can be applied by plasma enhanced chemical vapor deposition (PECVD) of a precursor feed comprising an acyclic siloxane, a monocyclic siloxane, a polycyclic siloxane, a polysilsesquioxane, a monocyclic silazane, a polycyclic silazane, a polysilsesquiazane, a silatrane, a silquasilatrane, a silproatrane, an azasilatrane, an azasilquasiatrane, an azasilproatrane, or a combination of any two or more of these precursors. Some particular, non-limiting precursors contemplated for such use include octamethylcyclotetrasiloxane (OMCTS).

Figure 2:
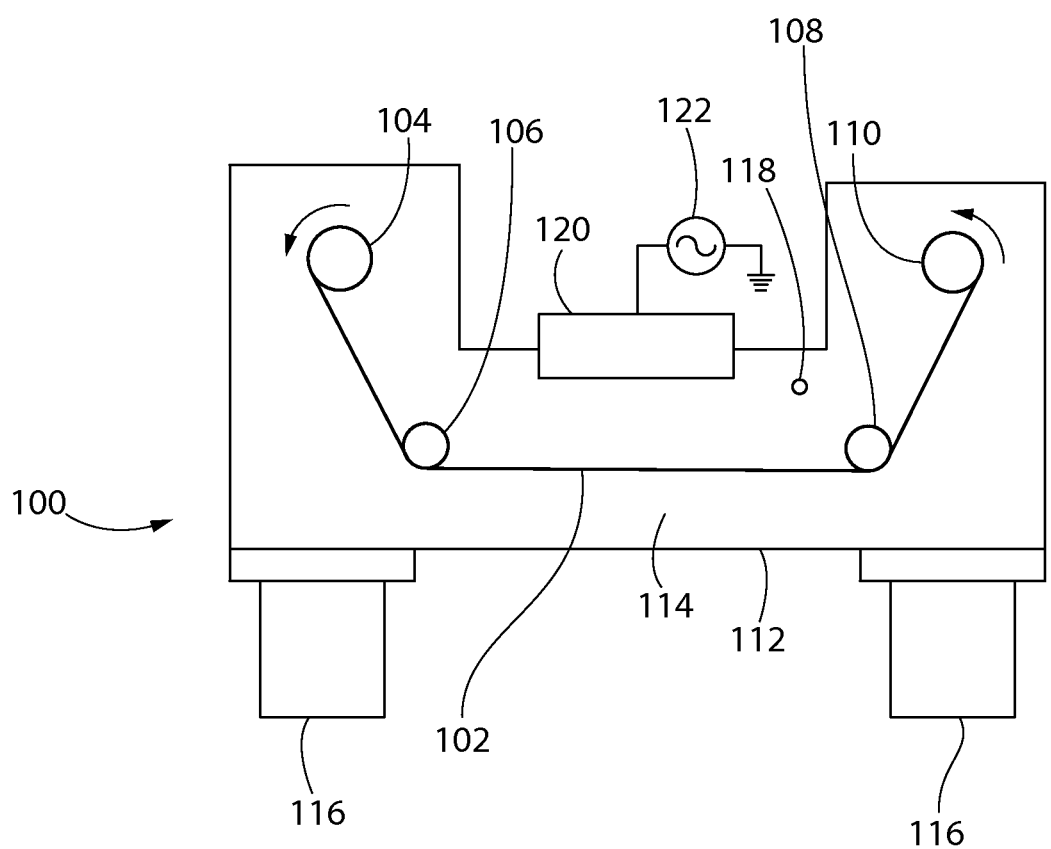
FIG. 2 illustrates an axial sectional view of an apparatus for applying a PECVD $SiO_x$ coating on a two-dimensional flexible polymer film roll, wherein the film, in subsequent processing steps is severable into sections and wherein one or more sections may be combined to form a storage bag that may be used according to the present invention.
Figure 3:
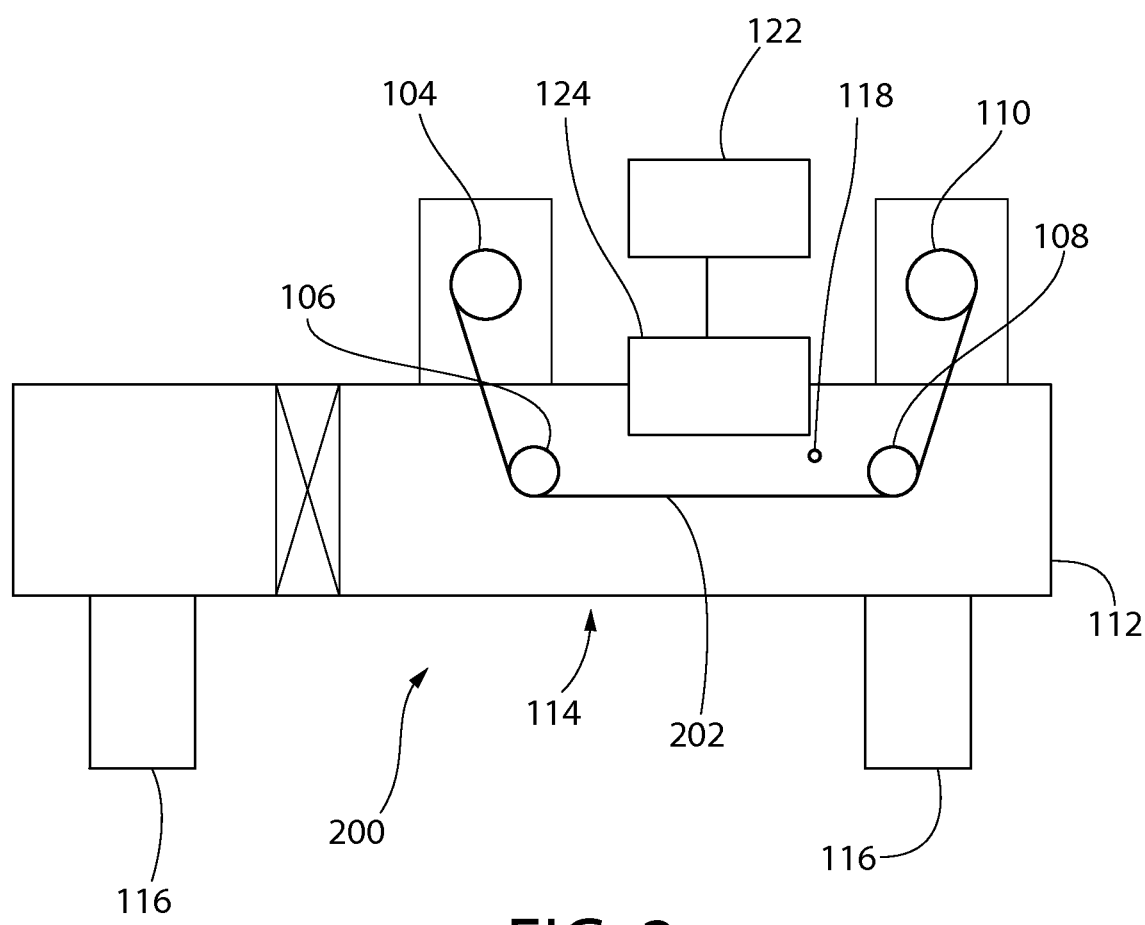
FIG. 3 illustrates an axial sectional view of an alternative apparatus for applying a PECVD $SiO_x$ coating on a two-dimensional flexible polymer film roll, wherein the film, in subsequent processing steps is severable into sections and wherein one or more sections may be combined to form a storage bag that may be used according to the present invention.

Referring to FIGS. 2 and 3, there are shown alternative embodiments of apparatus 100, 200, which may be used to apply PECVD $SiO_x$ coatings to flat flexible polymer films 102, 202, e.g., polyethylene. It is preferred that the coatings are applied in a bulk manufacturing process to rolls of the polymer films. The roll of coated film may then be separated into separate sheets according to known methods for constructing bags.

The respective PECVD coating apparatus of FIGS. 2 and 3 includes an unwind reel 104, guide rollers 106 and 108 and a rewind reel 110 to convey the film 102 or 202 within the chamber 112 through a treatment area 114. The chamber 112 is evacuated to a suitable pressure by the vacuum pumps 116. A gas inlet 118 is provided to introduce chemical vapor deposition precursors and reactants for forming the $SiO_x$ or other barrier coating. Plasma is generated in the treatment area 114 of FIG. 2 by an unbalanced magnetron 120 powered by an alternating current power source 122. Plasma is generated in the treatment area 114 of FIG. 3 by a cathode 124.

Processes for applying PECVD coatings to these rolls of film are described, for example in the following articles, which are incorporated herein by reference in their entireties: (1) L. Wood and H. Chatham, "A Comparison of $SiO_2$ Barrier Coated Polypropylene to Other Coated Flexible Substrates," 35$^{th}$ *Annual Technical Conference Proceedings, Society of Vacuum Coaters* (1992); (2) J. Fahlteich, N. Schiller, M. Fahland, S. Straach, S. Günther, and C. Brantz, "Vacuum Roll-to-Roll Technologies for Transparent Barrier Films," 54$^{th}$ *Annual Technical Conference Proceedings, Society of Vacuum Coaters*, Chicago, Ill. Apr. 16-21, 2011; and (3) J. T. Felts, 36$^{th}$ *Annual Technical Conference Proceedings, Society of Vacuum Coaters* (2011).

While the invention has been described in detail and with reference to specific examples thereof, it will be apparent to one skilled in the art that various changes and modifications can be made therein without departing from the spirit and scope thereof.

The invention claimed is:

1. A container comprising an external package and a sealed flexible bag adapted to hold liquid contents retained within the external package, the bag made from a polymer film comprising first and second major surfaces, at least the first major surface of the polymer film having a PECVD $SiO_x$ coating, the film having first and second portions heat-sealed together to define a sealed area with the PECVD $SiO_x$ coating sandwiched between the first and second heat-sealed portions.

2. The container of claim 1, wherein the external package comprises one or more rigid or semi-rigid materials selected from the group consisting of plastic, cardboard and a soft metal.

3. The container of claim 1, wherein the heat-sealed portions consist essentially of polyethylene.

4. The container of claim 1, wherein the bag holds a high purity solvent.

5. The container of claim 4, wherein the high purity solvent is hexane.

6. The flexible bag of claim 1, in which the PECVD $SiO_x$ coating functions as an oxygen barrier and consists essentially of $SiO_x$, in which x is from about 1.5 to about 2.9.

7. The flexible bag of claim 6, in which the PECVD $SiO_x$ coating is from 10 to 200 nm thick.

8. The flexible bag of claim 6, in which the PECVD $SiO_x$ coating is on the first major surface only.

9. The flexible bag of claim 8, in which the PECVD $SiO_x$ coating is coextensive with the first major surface.

10. The flexible bag of claim 1, in which the first and second heat-sealed portions define a lapped seal.

11. The flexible bag of claim 1, in which the first and second heat-sealed portions define a face-to-face seal.

* * * * *